United States Patent
Yamada et al.

(10) Patent No.: US 12,424,416 B2
(45) Date of Patent: Sep. 23, 2025

(54) SUBSTRATE PROCESSING APPARATUS AND PARAMETER ACQUISITION METHOD

(71) Applicant: Tokyo Electron Limited, Tokyo (JP)

(72) Inventors: Kazuhito Yamada, Miyagi (JP); Hiroki Endo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1162 days.

(21) Appl. No.: 17/325,594

(22) Filed: May 20, 2021

(65) Prior Publication Data

US 2021/0366692 A1 Nov. 25, 2021

(30) Foreign Application Priority Data

May 21, 2020 (JP) .................. 2020-088967

(51) Int. Cl.
    *H01J 37/32* (2006.01)
    *H01L 21/67* (2006.01)
    *H01L 21/683* (2006.01)
    *H05B 1/02* (2006.01)
    *H05B 3/28* (2006.01)

(52) U.S. Cl.
CPC .. *H01J 37/32522* (2013.01); *H01L 21/67248* (2013.01); *H01L 21/67253* (2013.01); *H01L 21/6831* (2013.01); *H01L 21/6833* (2013.01); *H05B 1/0233* (2013.01); *H05B 3/283* (2013.01); *H01J 2237/334* (2013.01); *H05B 2213/07* (2013.01)

(58) Field of Classification Search
None
See application file for complete search history.

(56) References Cited

U.S. PATENT DOCUMENTS

| | | | | |
|---|---|---|---|---|
| 2008/0309239 | A1* | 12/2008 | Kasai | H01J 37/32201 315/39.51 |
| 2010/0000970 | A1* | 1/2010 | Koshimizu | H01J 37/32642 156/345.48 |
| 2010/0149385 | A1* | 6/2010 | Tay | H04N 25/65 348/241 |
| 2012/0074951 | A1 | 3/2012 | Chen et al. | |
| 2012/0076477 | A1* | 3/2012 | Kuroiwa | H01L 21/67248 392/407 |

(Continued)

FOREIGN PATENT DOCUMENTS

| | | | | |
|---|---|---|---|---|
| CA | 2859176 C | * | 10/2016 | G01V 1/164 |
| CA | 3046157 A1 | * | 7/2018 | A24F 40/10 |

(Continued)

*Primary Examiner* — Thor S Campbell
(74) *Attorney, Agent, or Firm* — XSENSUS LLP

(57) ABSTRACT

A substrate processing apparatus includes a heater resistor; a digital filter configured to filter at least one of a detection voltage, which is a digital voltage value detected as a voltage applied to the heater resistor, or a detection current, which is detected as a voltage calculated from the heater resistor and a current flowing in the heater resistor and converted into a digital voltage value; and a controller configured to control a temperature of the heater resistor with the detection voltage and the detection current, at least one of the detection voltage or the detection current being filtered by the digital filter.

10 Claims, 11 Drawing Sheets

(56) References Cited

U.S. PATENT DOCUMENTS

| | | | | |
|---|---|---|---|---|
| 2015/0055940 A1* | 2/2015 | Steinhauser | ............ | H05B 3/22 |
| | | | | 219/490 |
| 2015/0185083 A1 | 7/2015 | Aberra et al. | | |
| 2016/0314943 A1* | 10/2016 | Albarede | ............ | H01J 37/3299 |
| 2017/0372928 A1* | 12/2017 | Yamada | ............... | H05B 1/0233 |
| 2020/0275528 A1 | 8/2020 | Muneishi | | |
| 2021/0120883 A1* | 4/2021 | Marubashi | ........... | H05B 3/0019 |
| 2022/0070977 A1* | 3/2022 | Yamada | ............. | G05D 23/1917 |

FOREIGN PATENT DOCUMENTS

| | | | | |
|---|---|---|---|---|
| CA | 3086719 A1 * | 7/2019 | ............. | A24F 40/50 |
| JP | 2017-073247 A | 4/2017 | | |
| JP | 2017-228230 A | 12/2017 | | |
| JP | 2019-212670 A | 12/2019 | | |
| TW | 201215246 A | 4/2012 | | |
| TW | 201531680 A | 8/2015 | | |
| WO | WO-2018122410 A1 * | 7/2018 | ............. | A24F 40/10 |
| WO | 2019/083045 A1 | 5/2019 | | |
| WO | WO-2022232014 A1 * | 11/2022 | ......... | C23C 16/4586 |

\* cited by examiner

SUBSTRATE PROCESSING APPARATUS AND PARAMETER ACQUISITION METHOD

CROSS-REFERENCE TO RELATED APPLICATION

This application claims the benefit of Japanese Patent Application No. 2020-088967 filed on May 21, 2020, the entire disclosure of which is incorporated herein by reference.

TECHNICAL FIELD

The exemplary embodiments described herein pertain generally to a substrate processing apparatus and a parameter acquisition method.

BACKGROUND

It has been known that a heater temperature control is performed in a substrate processing apparatus (see, for example, Patent Document 1).

Patent Document 1: Japanese Patent Laid-open Publication No. 2019-212670

SUMMARY

In one exemplary embodiment, a substrate processing apparatus includes a heater resistor; a digital filter configured to filter at least one of a detection voltage, which is a digital voltage value detected as a voltage applied to the heater resistor, or a detection current, which is detected as a voltage calculated from the heater resistor and a current flowing in the heater resistor and converted into a digital voltage value; and a controller configured to control a temperature of the heater resistor with the detection voltage and the detection current, at least one of the detection voltage or the detection current being filtered by the digital filter.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
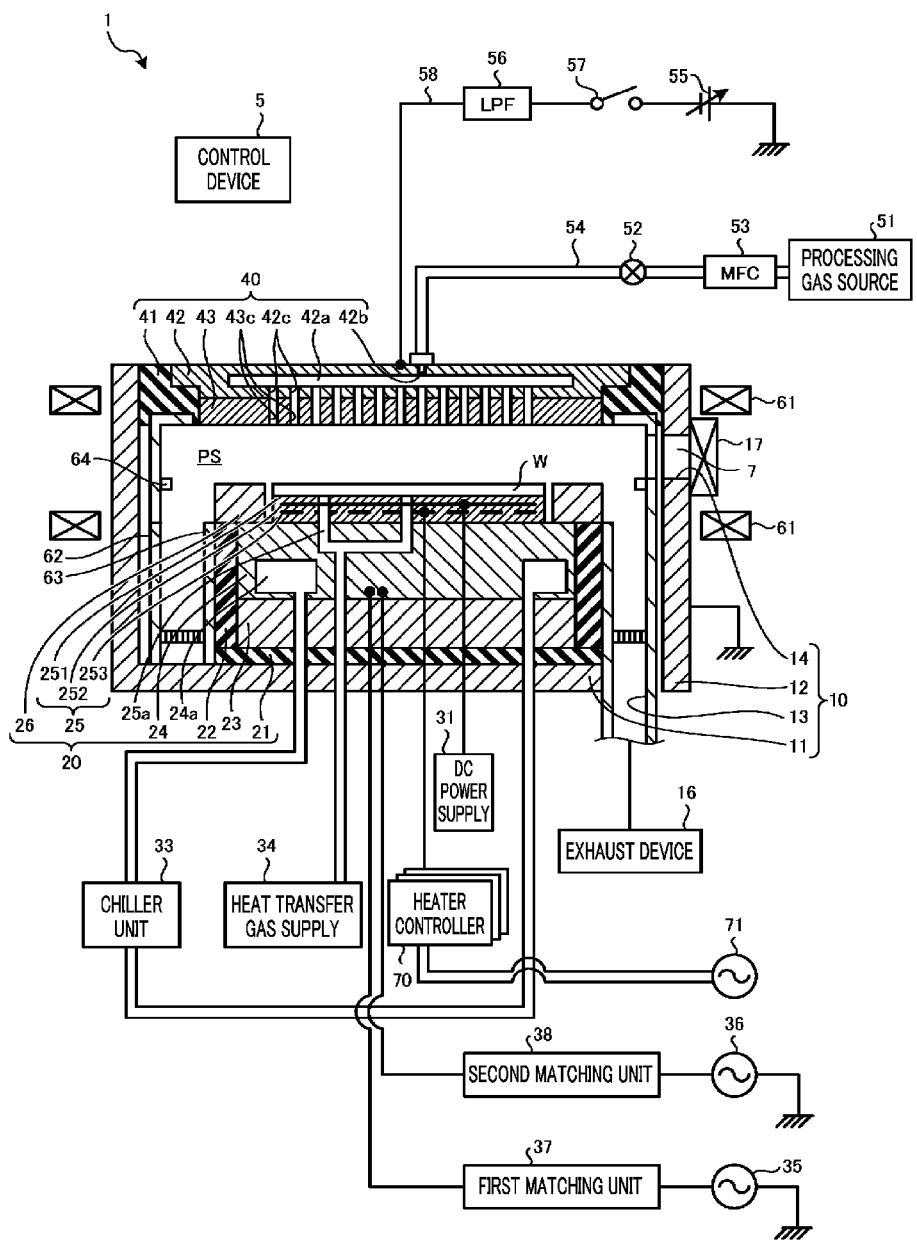
FIG. 1 illustrates an exemplary schematic configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a parameter acquisition method of the present disclosure will be described in detail with reference to the accompanying drawings. However, the substrate processing apparatus and the parameter acquisition method of the present disclosure will not be limited to the present exemplary embodiments.

When a heater temperature is controlled in a substrate processing apparatus, a resistance value of a heater resistor may be calculated. This is because a certain relationship exists between the heater temperature and the heater resistor, and the heater temperature can be acquired from the heater resistance value. To calculate the resistance value, a voltage applied to the heater resistor and a current flowing through the heater resistor are detected. If the detected voltage and the detected current contain noises, the accuracy of control of the heater temperature decreases. Therefore, a technique for improving the accuracy of control of the heater temperature has been expected.

Hereinafter, exemplary embodiments of a substrate processing apparatus and a parameter acquisition method of the present disclosure will be described in detail with reference to the accompanying drawings. The disclosed technique is not limited by the following exemplary embodiments. Also, the exemplary embodiment can be appropriately combined as long as they are not contradictory to each other.

FIG. 1 illustrates an exemplary schematic configuration of a substrate processing apparatus according to an exemplary embodiment. Hereinafter, each component of a substrate processing apparatus 1 will be described.

The substrate processing apparatus 1 includes a chamber 10, an exhaust device 16 and a gate valve 17. FIG. 1 shows a transversal cross-sectional view of the chamber 10. In this example, the chamber 10 includes a bottom wall 11 and a side wall 12, and has a substantially cylindrical shape. The chamber 10 is made of, for example, aluminum. An inner surface of the chamber 10 (an inner surface of the bottom wall 11 and/or the side wall 12) may be coated with an anodic oxide film. A space in which a substrate (a wafer W in this example) is processed inside the chamber 10 will be referred to as "processing space PS". The processing space PS is isolated from an external atmosphere by the chamber 10. An exhaust port 13 connected to the exhaust device 16 is formed at the bottom wall 11 of the chamber 10. The exhaust device 16 exhausts gas from the processing space PS through the exhaust port 13 to depressurize the processing space PS to a predetermined vacuum level. An opening 14 connected to the gate valve 17 is formed at the side wall 12 of the chamber 10. The gate valve 17 opens and closes the opening 14.

The substrate processing apparatus 1 further includes a placing table 20. The placing table 20 is placed under the processing space PS inside the chamber 10. The placing table 20 includes an insulating plate 21, an inner wall member 22, a support 23, a base member 24, an electrostatic chuck 25 and an edge ring 26.

The insulating plate 21 and the inner wall member 22 have an insulating property and insulate the other part of the placing table 20 from the chamber 10. The insulating plate 21 is placed on the bottom wall 11 of the chamber 10. The insulating plate 21 has a disc shape. The inner wall member 22 is placed on a peripheral portion of the insulating plate 21. The inner wall member 22 has a cylindrical shape. The inner wall member 22 is made of, for example, quartz.

The support 23 and the base member 24 are placed inside the inner wall member 22. The support 23 has a conductive property and is placed on the insulating plate 21. The base member 24 is placed on the support 23. The base member 24 is made of, for example, aluminum. A coolant circulation path 24a connected to a chiller unit 33 to be described later is provided within the base member 24.

The electrostatic chuck 25 is placed on the base member 24. The electrostatic chuck 25 includes a main body 251, an electrode 252 and a plurality of heaters 253. The main body 251 has an insulating property. The electrode 252 and the heaters 253 are buried in the main body 251. In this example, the electrostatic chuck 25 includes the plurality of heaters 253. A heat transfer gas supply path 25a is formed to penetrate the electrostatic chuck 25 to a top surface of the electrostatic chuck 25. The electrostatic chuck 25 and the plurality of heaters 253 will be described in more detail with reference to FIG. 2.

Figure 2:
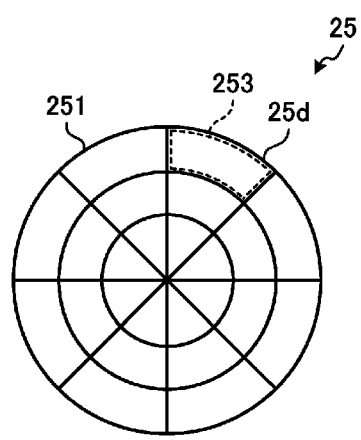
FIG. 2 shows an exemplary plan view of an electrostatic chuck.

FIG. 2 shows an exemplary plan view of an electrostatic chuck. The top surface of the electrostatic chuck 25 is divided into a plurality of regions 25d. In this example, the top surface of the electrostatic chuck 25 is divided into three regions in a diametrical direction and eight regions in a circumferential direction, but is not particularly limited thereto. The plurality of heaters 253 is buried in the corresponding regions 25d, respectively. When AC power is supplied from an AC power supply 71, the heaters 253 heat the corresponding regions 25d of the electrostatic chuck 25.

Referring to FIG. 1 again, the edge ring 26 is placed on the inner wall member 22 and the base member 24 so that the electrostatic chuck 25 is disposed inside the edge ring 26. The edge ring 26 is made of, for example, single-crystal silicon.

The substrate processing apparatus 1 further includes a DC power supply 31, the chiller unit 33 and a heat transfer gas supply 34. The DC power supply 31 applies a DC voltage to the electrode 252 of the electrostatic chuck 25. The chiller unit 33 cools a coolant to a predetermined temperature, and circulates the cooled coolant in the coolant circulation path 24a. The heat transfer gas supply 34 supplies a heat transfer gas (for example, He gas) to a space between the substrate (the wafer W in this example) and the electrostatic chuck 25 through the heat transfer gas supply path 25a.

The substrate processing apparatus 1 further includes a plurality of heater controllers 70. The plurality of heater controllers 70 are provided corresponding to the plurality of heaters 253, respectively. The heaters 253 are supplied with power from the AC power supply 71. The AC power supply 71 may be, for example, a commercial power supply (with an effective value of about 200 V and a frequency of 60 Hz). The heater controllers 70 and the heaters 253 will be described in more detail with reference to the drawings after FIG. 3.

The substrate processing apparatus 1 further includes a first high frequency power supply 35 and a second high frequency power supply 36. The first high frequency power supply 35 supplies high frequency power having a first frequency (for example, 100 MHz) to the base member 24 via a first matching unit 37. The second high frequency power supply 36 supplies high frequency power having a second frequency (for example, 13 MHz) lower than the first frequency to the base member 24 via a second matching unit 38.

The substrate processing apparatus 1 further includes a shower head 40. The shower head 40 is located above the placing table 20 inside the processing space PS so that a bottom surface of the shower head 40 faces the placing table 20 and the plane of the bottom surface of the shower head 40 is substantially parallel to the plane of a top surface of the placing table 20.

The shower head 40 includes an insulating member 41, a main body 42 and an upper ceiling plate 43.

The insulating member 41 insulates the other part of the shower head 40 from the chamber 10. The insulating member 41 is supported at an upper portion of the chamber 10. The main body 42 has a conductive property and is supported by the insulating member 41. The main body 42 is made of, for example, aluminum and may have an anodically oxidized surface. The main body 42 and the base member 24 are used as an upper electrode and a lower electrode (a pair of electrodes). The upper ceiling plate 43 is placed under the main body 42 and supported by the main body 42 so as to be detachable from the main body 42. The upper ceiling plate 43 is made of a silicon-containing material such as quartz.

A gas diffusion chamber 42a, a gas inlet 42b and gas outlets 42c are formed in the main body 42. The gas diffusion chamber 42a is formed inside the main body 42. The gas inlet 42b is formed above the gas diffusion chamber 42a in the main body 42 and communicates with the gas diffusion chamber 42a. A plurality of gas outlets 42c is formed on the upper ceiling plate 43 side of the gas diffusion chamber 42a in the main body 42 and communicates with the gas diffusion chamber 42a.

A plurality of gas inlets 43c is formed in the upper ceiling plate 43. The plurality of gas inlets 43c is formed so as to penetrate a top surface and a bottom surface of the upper ceiling plate 43 and communicates with the plurality of gas outlets 42c, respectively.

The substrate processing apparatus 1 further includes a processing gas source 51, a valve 52 and a mass flow controller (MFC) 53.

The processing gas source 51 is connected to the gas inlet 42b in the main body 42 of the shower head 40 via a pipe 54.

The mass flow controller 53 is provided in the middle of the pipe 54. The valve 52 is provided between the mass flow controller 53 and the gas inlet 42b in the pipe 54. When the valve 52 is opened or closed, the amount of processing gas to be supplied from the processing gas source 51 to the gas inlet 42b is adjusted.

The substrate processing apparatus 1 further includes a variable DC power supply 55, a low pass filter (LPF) 56 and a switch 57. The variable DC power supply 55 is electrically connected to the main body 42 of the shower head 40 via an electric path 58. The low pass filter 56 and the switch 57 are provided in the middle of the electric path 58. The switch 57 is opened and closed so as to apply a DC voltage to the shower head 40.

The substrate processing apparatus 1 further includes a ring magnet 61. The ring magnet 61 forms a magnetic field between the shower head 40 and the placing table 20 in the processing space PS. The ring magnet 61 is arranged concentrically with the chamber 10 so that the chamber 10 is disposed inside the ring magnet 61. The ring magnet 61 is rotatably supported by the chamber 10 via a non-illustrated rotation mechanism. The ring magnet 61 is formed of, for example, a permanent magnet.

The substrate processing apparatus 1 further includes a deposition shield 62, a deposition shield 63 and a conductive member 64. The deposition shield 62 suppresses adhesion of an etching byproduct (deposit) to an inner peripheral surface of the side wall 12 of the chamber 10. The deposition shield 62 is placed to cover the inner peripheral surface of the side wall 12 of the chamber 10 and supported by the chamber 10 to be detachable from the chamber 10. The deposition shield 63 suppresses adhesion of an etching byproduct to an outer peripheral surface of the inner wall member 22. The deposition shield 63 is placed to cover the outer peripheral surface of the inner wall member 22. The conductive member 64 suppresses abnormal discharge inside the chamber 10. The conductive member 64 is arranged in the processing space PS so that the height at which the conductive member 64 is arranged is substantially the same as the height at which the wafer W placed on the electrostatic chuck 25 is arranged, and the conductive member 64 is supported by the deposition shield 62. The conductive member 64 is electrically connected to a ground.

The substrate processing apparatus 1 further includes a control device 5. The control device 5 controls the entire substrate processing apparatus 1 by controlling each component of the substrate processing apparatus 1. The control device 5 is implemented by a computer including, for example, a central processing unit (CPU), a random access memory (RAM) and a read only memory (ROM).

An outline of operations for substrate processing (plasma etching) performed by the above-described substrate processing apparatus 1 will be described. The opening 14 is opened by controlling the gate valve 17. The wafer W is carried into the processing space PS through the opening 14 and then placed on the placing table 20. The DC power supply 31 applies a DC voltage to the electrode 252 so as to hold the wafer W on the electrostatic chuck 25 by Coulomb force. The opening 14 is closed by controlling the gate valve 17. Then, the atmosphere in the processing space PS is evacuated to a predetermined vacuum level by controlling the exhaust device 16. A predetermined amount of processing gas is supplied from the processing gas source 51 to the gas inlet 42b by controlling the valve 52. The processing gas is also supplied in a shower shape to the processing space PS in the chamber 10 through the plurality of gas outlets 42c and the plurality of gas inlets 43c.

A heat transfer gas is supplied to the heat transfer gas supply path 25a (between the electrostatic chuck 25 and the wafer W) by controlling the heat transfer gas supply 34. The coolant cooled to a predetermined temperature is circulated in the coolant circulation path 24a so as to cool the electrostatic chuck 25 by controlling the chiller unit 33. The heater controllers 70 control the temperature of the heaters 253 to reach a target temperature (set temperature).

High frequency power is supplied to the base member 24 on the placing table 20 by controlling the first high frequency power supply 35 and the second high frequency power supply 36. Plasma is formed between the placing table 20 and the shower head 40 in the processing space PS. A DC voltage of a predetermined magnitude is supplied from the variable DC power supply 55 to the shower head 40 by controlling the variable DC power supply 55 and the switch 57. The wafer W is etched by the plasma formed in the processing space PS. Examples of the plasma may include capacitively coupled plasma (CCP), inductively coupled plasma (ICP), radial line slot antenna plasma, electron cyclotron resonance plasma (ECR), helicon wave plasma (HWP) and the like.

After the wafer W is etched, the supply of high frequency power to the base member 24 of the placing table 20 is stopped by controlling the first high frequency power supply 35 and the second high frequency power supply 36. The application of DC voltage to the shower head 40 is stopped by controlling the variable DC power supply 55 and the switch 57. The opening 14 is opened by controlling the gate valve 17. The wafer W held by the electrostatic chuck 25 is released by controlling the DC power supply 31. The wafer W is carried out of the processing space PS in the chamber 10 through the opening 14. During plasma etching, the temperature of the wafer W can be appropriately adjusted to a predetermined temperature, and, thus, the wafer W can be appropriately etched.

The heater controllers 70 and the heaters 253 will be described in more detail. Hereinafter, a pair of the heater controller 70 and the heater 253 in the plurality of heater controllers 70 and the plurality of heaters 253 will be described, but the same applies to the other pairs of the heater controller 70 and the heater 253.

Figure 3:
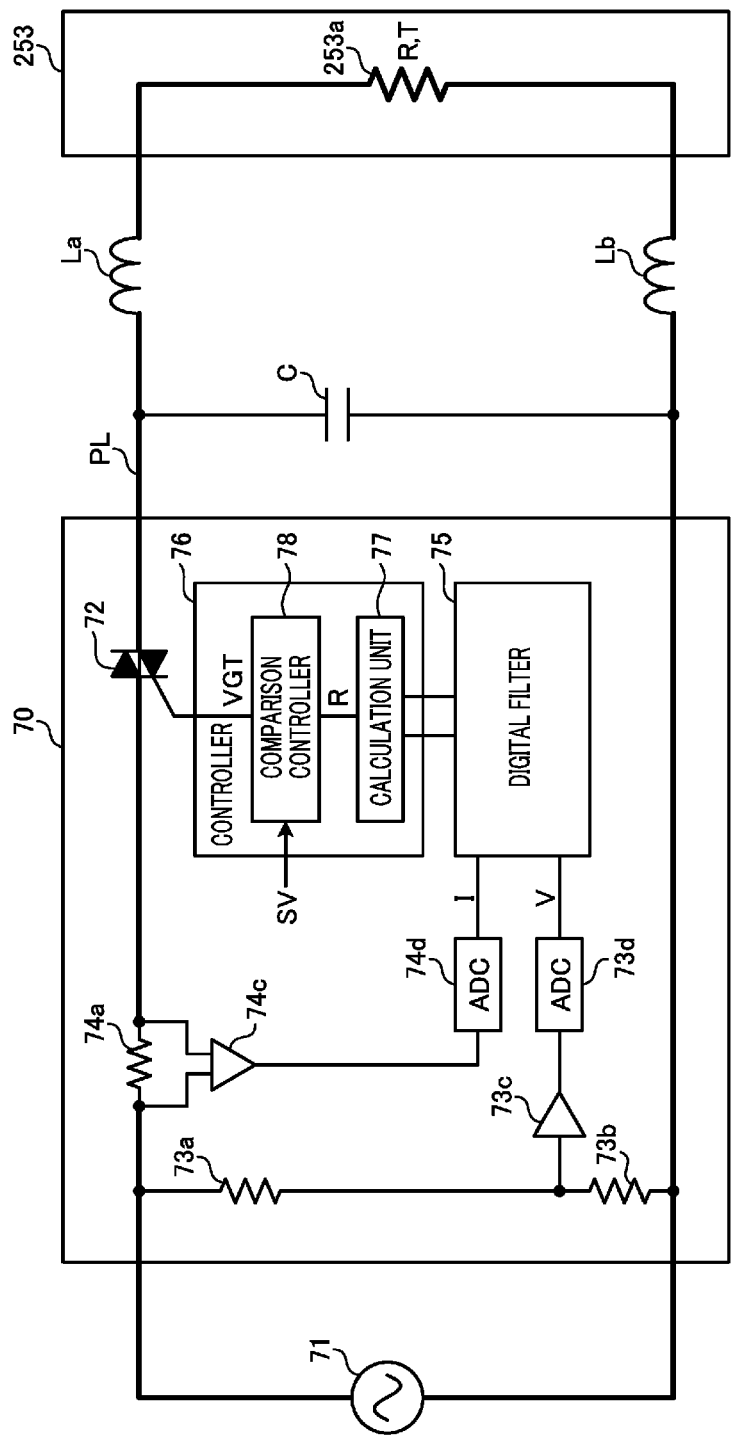
FIG. 3 illustrates an exemplary schematic configuration of a heater controller and a heater.

FIG. 3 illustrates an exemplary schematic configuration of a heater controller and a heater. The heater controller 70 is electrically connected between the AC power supply 71 and the heater 253. The heater 253 includes a heater resistor 253a. The heater resistor 253a is heated by the power applied thereto (a voltage applied to the heater resistor 253a and a current flowing in the heater resistor 253a). The heater controller 70 is configured to heat the heater resistor 253a using the power from the AC power supply 71. A main power path from the AC power supply 71 to the heater resistor 253a will be referred to as "power line PL". A resistance value and a temperature of the heater resistor 253a will be referred to as "heater resistance value R" and "heater temperature T", respectively. The heater resistance value R is, for example, 40Ω. In this case, when an AC voltage with an effective value of 200 V is applied to the heater resistor 253a, an AC with an effective value of 5 A flows in the heater resistor 253a. In the present disclosure, the heater temperature T is regarded as the same as the temperature of the heater 253.

A coil La, a coil Lb and a capacitor C are connected between the heater controller 70 and the heater resistor 253a. The coil La and the coil Lb are connected between the heater controller 70 and the heater resistor 253a such that a power flowing in the power line PL passes in series. The capacitor C is connected such that the power flowing in the power line PL passes in parallel. The coil La, the coil Lb and the capacitor C allow an AC power from the AC power supply 71 to the heater 253 to pass through and reduce a high frequency noise flowing from the heater 253 side to the heater controller 70.

The heater controller 70 includes a switch 72, a resistor 73a, a resistor 73b, an amplifier 73c, an AD converter (ADC: Analog to Digital Converter) 73d, a resistor 74a, an amplifier 74c, an AD converter 74d, a digital filter 75 and a controller 76. The heater controller 70 may be configured as a substrate (heater control substrate) equipped with these components.

In the heater controller 70, the switch 72 and the resistor 74a are provided in series on the power line PL between the AC power supply 71 and the heater resistor 253a. FIG. 3 illustrates a TRIAC (bidirectional triode thyristor) as the switch 72. The resistor 74a has a very small resistance value (for example, about 100 mΩ), and a voltage drop generated in the resistor 74a is much smaller than a voltage of the AC power supply 71. That is, when the switch 72 is turned on, a voltage corresponding to the voltage of the AC power supply 71 is applied to the heater resistor 253a. Further, a current corresponding to the current from the AC power supply 71 flows in the heater resistor 253a.

The heater controller 70 controls a conduction period of the switch 72 to make the temperature of the heater resistor 253a close to the set temperature. The conduction period may be a conduction period in a half (½) cycle of the AC power supply 71 (for example, 60 Hz). By controlling the conduction period of the switch 72, not only the power supplied from the AC power supply 71 to the heater resistor 253a but also the heater temperature T can be controlled. To monitor the heater temperature T during this control, the heater resistance value R is calculated. This is because the heater resistance value R changes in a conventional manner as the heater temperature T changes.

The heater resistance value R is calculated based on the voltage applied to the heater resistor 253a and the current flowing in the heater resistor 253a. A voltage detected as the voltage applied to the heater resistor 253a will be referred to as "detection voltage V". A current detected as the current flowing in the heater resistor 253a will be referred to as "detection current I". The detection voltage V and the detection current I may be digital voltage values (voltage waveform) detected over a predetermined period of time. The minimum unit of the predetermined period of time may be the half (½) cycle of the AC power supply 71. In this case, the predetermined period of time may be an integer multiple of the half (½) cycle of the AC power supply 71.

The detection voltage V is detected by the resistor 73a, the resistor 73b, the amplifier 73c and the AD converter 73d (voltage detector). The resistor 73a and the resistor 73b are connected to each other in series and configured to divide the voltage of the AC power supply 71. The divided voltages are acquired (detected) via the amplifier 73c and converted into digital voltage values by the AD converter 73d. The resistor 73a, the resistor 73b, the amplifier 73c and the AD converter 73d are designed to indicate (calculate) the digital voltage values as values corresponding to the magnitudes of voltages actually generated at both ends of the resistor 73a and the resistor 73b.

The detection current I is detected by the resistor 74a, the amplifier 74c and the AD converter 74d (current detector). At both ends of the resistor 74a, a voltage corresponding to the magnitude of the current flowing in the heater resistor 253a is generated. This voltage is acquired (detected) via the amplifier 74c and converted into a digital voltage value by the AD converter 74d. The resistor 74a, the amplifier 74c and the AD converter 74d are designed to indicate (calculate) the digital voltage value as a value corresponding to the magnitude of a current actually flowing in the resistor 74a. That is, the detection current I is a detection current detected as a voltage which is calculated from the heater resistor 253a and the current flowing in the heater resistor 253a and which is converted into a digital voltage value.

The digital filter 75 filters the detection voltage V and the detection current I. This is because, for example, a power supply which can be a source (noise source) of a noise voltage and a noise current is electrically connected to the heater resistor 253a, and the noise voltage and the noise current thereof can be contained in the detection voltage V and the detection current I. Examples of the power supply which can be the noise source may include the DC power supply 31, the first high frequency power supply 35, the second high frequency power supply 36 and the variable DC power supply 55 described above with reference to FIG. 1. In addition to these power supplies, all of power supplies used in the substrate processing apparatus 1 can be the noise source. For example, a pulse power supply may be used to improve an etching process. When the pulse power supply is capacitively coupled to the heater resistor 253a, the noise voltage and the noise current may be superimposed on the voltage applied to the heater resistor 253a and the current flowing in the heater resistor 253a (i.e., the detection voltage V and the detection current I). The noise voltage and the noise current will be described in detail with reference to FIG. 4 to FIG. 7.

Figure 4:
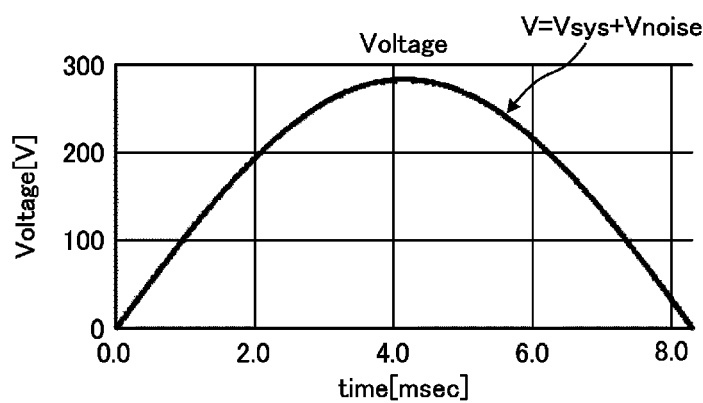
FIG. 4 shows an exemplary voltage waveform.
Figure 5:
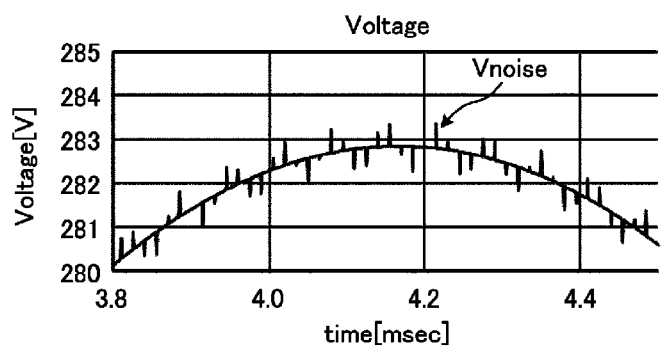
FIG. 5 shows an exemplary voltage waveform.

FIG. 4 and FIG. 5 show exemplary voltage waveforms. The horizontal axis in the graph represents the time and the vertical axis represents the instantaneous voltage value (V). FIG. 4 shows an exemplary waveform for a half (½) cycle of the detection voltage V with a frequency of 60 Hz and an effective value of 200 V. FIG. 5 is an enlarged view of a part of the waveform of FIG. 4. As shown in FIG. 5, the detection voltage V is a voltage in which a noise voltage (with a frequency higher than 60 Hz) is superimposed on a signal voltage (with a frequency of 60 Hz). The signal voltage is a voltage from the AC power supply 71, for example, a voltage (system voltage) from a commercial power supply. Thus, the signal voltage will be referred to as "signal voltage Vsys". The noise voltage will be referred to as "noise voltage Vnoise". The signal voltage Vsys corresponds to a voltage when it is assumed that the noise voltage Vnoise is not present in the detection voltage V. The waveform of the detection voltage V is deformed from a waveform of the signal voltage Vsys as much as the amount of the noise voltage Vnoise contained in the detection voltage V. This deformation influences, for example, a value (effective value or the like) determined based on the voltage waveform. For example, the effective value is increased by the amount of the noise voltage Vnoise.

Figure 6:
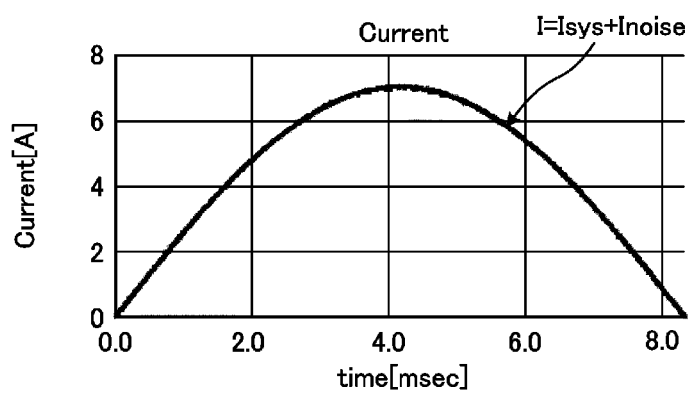
FIG. 6 shows an exemplary current waveform.
Figure 7:
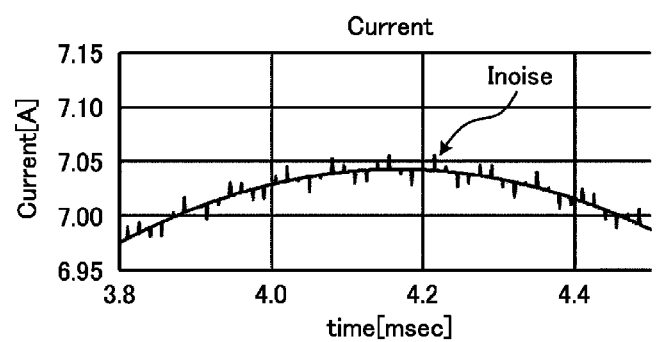
FIG. 7 shows an exemplary current waveform.

FIG. 6 and FIG. 7 show exemplary current waveforms. FIG. 6 shows an exemplary current waveform for a half (½) cycle with a frequency of 60 Hz and an effective value of 200 V. FIG. 7 is an enlarged view of a part of the current waveform of FIG. 6. As shown in FIG. 7, the detection current I is a current in which a noise current is superimposed on a signal current. The signal current will be referred to as "signal current Isys". The noise current will be referred to as "noise current Inoise". The signal current Isys corresponds to a current when it is assumed that the noise current Inoise is not present in the detection current I. The waveform of the detection current I is deformed from a waveform of the signal current Isys as much as the amount of the noise current Inoise contained in the detection current I. This deformation influences, for example, a value (effective value or the like) determined based on the current waveform. For example, the effective value is increased by the amount of the noise current Inoise.

Here, in many cases, the degree of influence of the noise voltage Vnoise on the signal voltage Vsys may be different from the degree of influence of the noise current Inoise on the signal current Isys. In such a case, the value on the left-hand side is not equal to the value on the right-hand side as shown in the following Formula (1).

[Formula 1]

$$\frac{Vnoise}{Vsys} \neq \frac{Inoise}{Isys} \quad (1)$$

The inequality in Formula (1) leads to a decrease in the calculation accuracy of the heater resistance value R using the detection voltage V and the detection current I. Therefore, in the present exemplary embodiment, the digital filter 75 filters the noise voltage Vnoise and the noise current Inoise such that the value on the left-hand side and the value on the right-hand side of Formula (1) become close (equal) to each other. The digital filter 75 will be described in detail with reference to FIG. 8 to FIG. 10.

Figure 8:
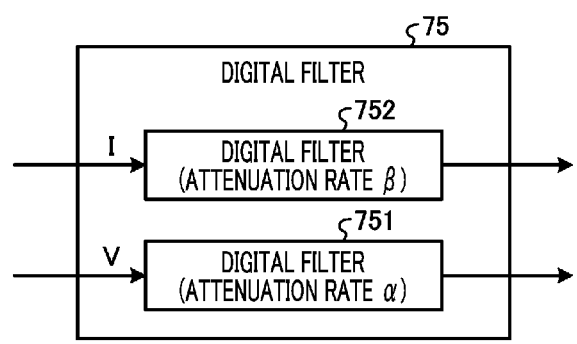
FIG. 8 shows an exemplary block diagram of a digital filter.

FIG. 8 shows an exemplary block diagram of a digital filter. In this example, the digital filter 75 includes a digital filter 751 (first digital filter) and a digital filter 752 (second digital filter).

The digital filter 751 is a low pass filter configured to attenuate the noise voltage Vnoise contained in the detection voltage V. An attenuation rate of the digital filter 751 for the noise voltage Vnoise will be referred to as "attenuation rate α". The attenuation rate α may have a value of 1 or less (α≤1.0).

The digital filter 752 is a low pass filter configured to attenuate the noise current Inoise contained in the detection current I. An attenuation rate of the digital filter 752 for the noise current Inoise will be referred to as "attenuation rate β". The attenuation rate β may have a value of 1 or less (attenuation rate β≤1.0).

Hereinafter, an outline of the digital filter will be described with reference to FIG. 9 and FIG. 10.

Figure 9:
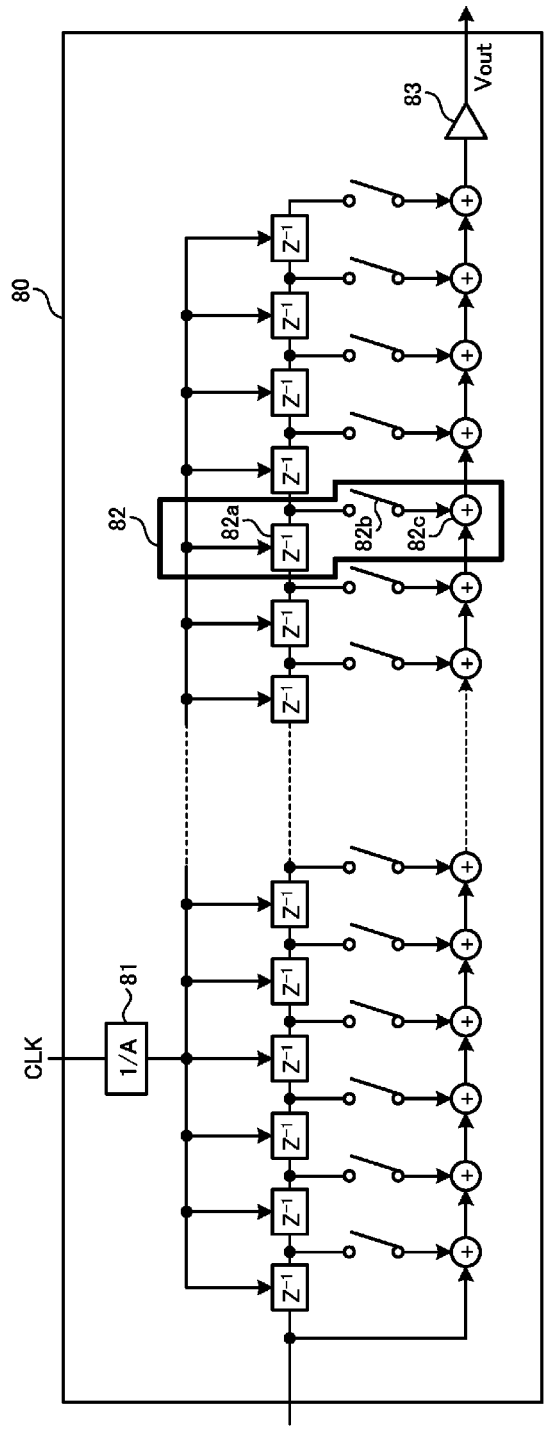
FIG. 9 illustrates an exemplary schematic configuration of the digital filter.

FIG. 9 illustrates an exemplary schematic configuration of the digital filter. A digital filter 80 shown in FIG. 9 filters an input voltage Vin and outputs the filtered voltage as an output voltage Vout. The digital filter 80 includes a divider 81, a plurality of tabs 82 and a multiplier 83. In FIG. 9, only one tap 82 is assigned a reference numeral, and the tap 82 includes a delayer 82a, a switch 82b and an adder 82c.

The divider 81 divides a given clock CLK (for example, 100 MHz) at a division ratio A. The division ratio A can be arbitrarily selected. The divided clock CLK is supplied to the delayer 82a of each of the plurality of tabs 82. The tap 82 is activated when the switch 82b is turned on (in a conduction state). The number of taps 82 (tap number) to be activated can be arbitrarily selected by individually controlling the switch 82b of each of the plurality of tabs 82. The taps 82 are activated sequentially from one close to the input voltage Vin. A voltage applied with a delay amount by the delayer 82a of the activated tap 82 is added to the input voltage Vin by the adder 82c of the corresponding tap 82, and then, multiplied by a predetermined number through the multiplier 83. The predetermined number is, for example, 1/(N+1) when the tap number is N. The output voltage Vout acquired as described above is a voltage filtered from the input voltage Vin.

The filtering characteristics of the digital filter 80 are adjusted by the division ratio A and the tap number N. Examples of the filtering characteristics may include a cutoff frequency (a frequency of –3 dB). The cutoff frequency will be described with reference to FIG. 10.

Figure 10:
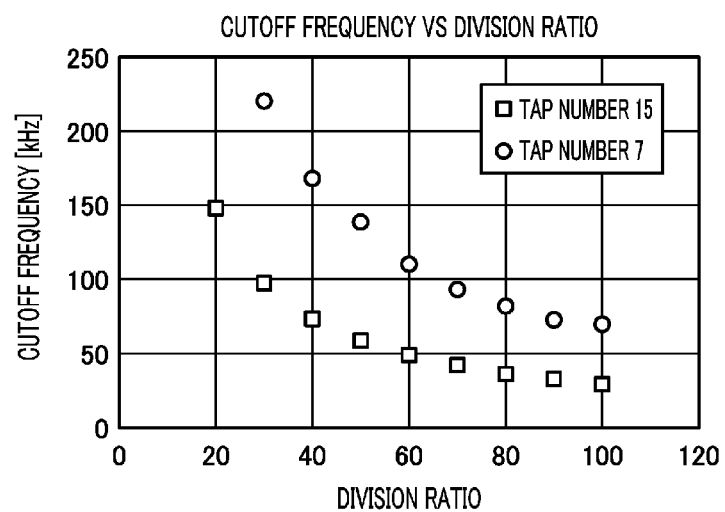
FIG. 10 shows an example of a relationship between a division ratio and a cutoff frequency.

FIG. 10 shows an example of a relationship between a division ratio and a cutoff frequency. The horizontal axis in the graph represents the division ratio and the vertical axis represents the cutoff frequency (kHz). In the graph, plotting circles show a relationship between the division ratio and the cutoff frequency when the tap number is 7, and plotting squares show a relationship between the division ratio and the cutoff frequency when the tap number is 15. As can be seen from FIG. 10, a desired cutoff frequency can be acquired by changing the division ratio and/or the tap number. For example, a cutoff frequency of about 50 kHz is acquired when the tap number is set to 15 and the division ratio is set to 60. As for an analog filter, it is necessary to change a hardware design, such as change a constant of an electronic component (change a part) in order to adjust the cutoff frequency. However, as for the digital filter, such a change is not necessary. Therefore, the filtering characteristics can be flexibly changed.

The above-described digital filter 80 is just an example of the digital filter 751 and the digital filter 752. Other digital filters of various configurations may be used as the digital filter 751 and the digital filter 752.

Referring to FIG. 8 again, the attenuation rate α of the digital filter 751 and the attenuation rate β of the digital filter 752 will be described in more detail. The attenuation rate α and the attenuation rate β are determined to reduce the inequality in Formula (1). That is, the attenuation rate α and the attenuation rate β are as shown in the following Formula (2).

[Formula 2]

$$\frac{\alpha \times Vnoise}{Vsys} \cong \frac{\beta \times Inoise}{Isys} \quad (2)$$

In this case, the attenuation rate α and the attenuation rate β are determined as values satisfying, for example, the following Formula (3).

[Formula 3]

$$\frac{Vsys + \alpha \times Vnoise}{Isys + \beta \times Inoise} = \frac{Vsys}{Isys} \quad (3)$$

The attenuation rate α and the attenuation rate β acquired as described above are attenuation rates for allowing the both sides of Formula (1), i.e., a ratio of the signal voltage Vsys and the noise voltage Vnoise and a ratio of the signal current Isys and the noise current Inoise, to be close (equal) to each other.

A cutoff frequency of the digital filter 751 is set to a cutoff frequency for giving the attenuation rate α between the attenuation rate α and the attenuation rate β that satisfy Formula (2) or Formula (3). A cutoff frequency of the digital filter 752 is set to a cutoff frequency for giving the attenuation rate α between the attenuation rate α and the attenuation rate β that satisfy Formula (2) or Formula (3). When the attenuation rate α and the attenuation rate β are different from each other, the cutoff frequency of the digital filter 751 is different from the cutoff frequency of the digital filter 752. Also, one of the attenuation rate α and the attenuation rate β may be 1.

Parameters of the digital filter 75 are controlled such that the digital filter 751 and the digital filter 752 can function as the low pass filters to show the desired filtering characteristics. An example of the parameters may include the above-described cutoff frequency. Another example of the parameters may include the attenuation rate α and the attenuation rate β. In addition to these parameters, various parameters capable of giving the filtering characteristics to the digital filter may be used. The parameters may be stored in a manner that can be referred to by, for example, the control device 5 (FIG. 1). The control device 5 sets the filtering characteristics of the digital filter 751 and the digital filter 752 depending on the parameters. For example, as for the digital filter 80 configured as described above with reference to FIG. 9, the division ratio A and/or the tap number N for acquiring the filtering characteristics indicated by the parameters are set by the control device 5.

Parameters of the digital filter 751 and the digital filter 752 may be individually prepared depending on the operating conditions of the above-described power supply which can be the noise source, the degree of coupling between the power supply and the heater resistor 253a and the like (hereinafter, simply referred to as "operating conditions of the power supply and the like"). In this case, parameters corresponding to the operating conditions of the power supply and the like are set. Such a method of acquiring the parameters will be described with reference to FIG. 13.

Referring to FIG. 3 again, the detection voltage V and the detection current I filtered by the digital filter 75 are input into the controller 76. The controller 76 controls the heater temperature using the detection voltage V and the detection current I. FIG. 3 illustrates a calculation unit 77 and a comparison controller 78 as components to perform representative processings among the components included in the controller 76.

The calculation unit 77 is configured to calculate the heater resistance value R using the detection voltage V and the detection current I filtered by the digital filter 75. The heater resistance value R is obtained by dividing the detection voltage V by the detection current I (i.e., R=V÷I). In the exemplary embodiment, the calculation unit 77 calculates the heater resistance value R using an effective value of the detection voltage V and an effective value of the detection current I. The effective value is obtained from, for example, the voltage waveform as indicated by the detection voltage V. The effective value is obtained from, for example, the current waveform as indicated by the detection current I.

The calculation unit 77 calculates the heater temperature T from the calculated heater resistance value R. For example, a polynomial equation for calculating the heater temperature T from the heater resistance value R may be prepared and the heater temperature T may be calculated by using the polynomial equation. A data table in which the heater resistance value R corresponds to the heater temperature T may be prepared and the heater temperature T may be calculated with reference to the data table. A range of the heater resistance value R varying depending on the heater temperature T is very narrow (for example, about 1%), and the calculation of the heater resistance value R can be easily influenced by external factors such as noise or the like. In this sense, it is important to improve the accuracy of calculation of the heater resistance value R in order to improve the accuracy of control of the heater temperature T.

The comparison controller 78 is configured to compare the calculation result (the heater resistance value R or the heater temperature T) of the calculation unit 77 with a set value SV. The set value SV is a target temperature (or heater resistance value) of the heater resistor 253a and is assigned by, for example, the outside of the heater controller 70. A comparison result may be, for example, a difference between the calculation result of the calculation unit 77 and the set value SV.

The comparison controller 78 controls the switch 72 based on the comparison result. For example, the comparison controller 78 controls the conduction period of the switch 72 to reduce the difference indicated as the comparison result. In this example, the switch 72 is the TRIAC, and, thus, the comparison controller 78 generates a gate trigger voltage VGT for controlling the conduction period to supply the gate trigger voltage VGT to the TRIAC.

As described above, the controller 76 controls the heater temperature T using the detection voltage V and the detection current I.

The above-described digital filter 75 and controller 76 (the calculation unit 77 and the comparison controller 78) are implemented by using, for example, a field programmable gate array (FPGA), a central processing unit (CPU) and the like. Some examples thereof will be described with reference to FIG. 11 and FIG. 12.

Figure 11:
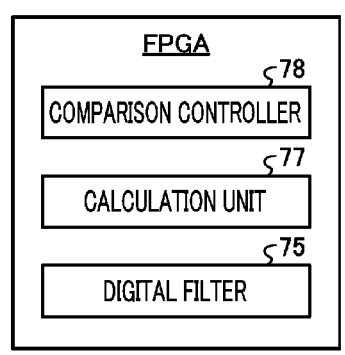
FIG. 11 illustrates an exemplary schematic configuration of a digital filter and a controller.
Figure 12:
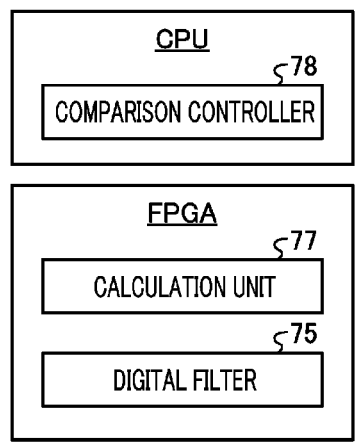
FIG. 12 illustrates an exemplary schematic configuration of the digital filter and the controller.

FIG. 11 and FIG. 12 illustrate exemplary schematic configurations of the digital filter and the controller. In the example shown in FIG. 11, the digital filter 75, and the calculation unit 77 and the comparison controller 78 (components of the controller 76) are implemented by the FPGA. In the example shown in FIG. 12, the digital filter 75 and the calculation unit 77 are implemented by the FPGA, and the comparison controller 78 is implemented by the CPU.

Hereinafter, an example of acquiring the parameters (cutoff frequency and the like) of the digital filter 751 and the digital filter 752 will be described with reference to FIG. 13.

Figure 13:
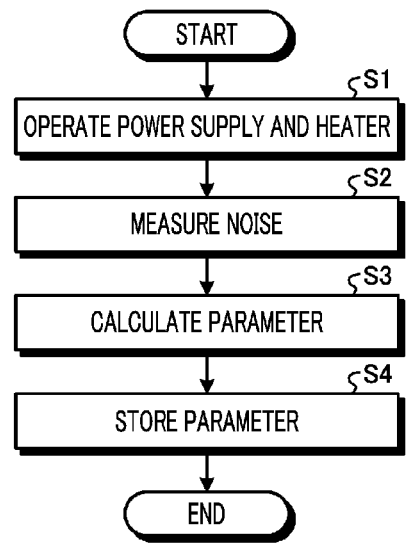
FIG. 13 is a flowchart showing an example of a parameter acquisition method according to the exemplary embodiment.

FIG. 13 is a flowchart showing an example of a parameter acquisition method according to the exemplary embodiment. This processing is performed using, for example, the substrate processing apparatus 1.

In a process S1, a power supply and heaters are operated. For example, the above-described power supply which can be the noise source is operated in the same conditions as when the wafer W is actually processed in the substrate processing apparatus 1. Likewise, the heaters 253 are heated.

In a process S2, the noise is measured. For example, the noise voltage Vnoise is measured at a detection point (the resistor 73a or the like) of the detection voltage V described above with reference to FIG. 3. The noise current Inoise is measured at a detection point (the resistor 74a or the like) of the detection current I. Also, for example, the noise voltage Vnoise is measured from the digital voltage value converted by the AD converter 73d. The noise current Inoise is measured from the digital current value converted by the AD converter 74d.

In a process S3, the parameters are calculated. For example, the cutoff frequency of the digital filter 751 and the cutoff frequency of the digital filter 752 are calculated. That is, the cutoff frequency corresponding to the attenuation rate α satisfying Formula (2) or Formula (3) and the cutoff frequency corresponding to the attenuation rate β satisfying Formula (2) or Formula (3) are calculated.

In a process S4, the parameters are stored. That is, the parameters calculated in the process S3 are stored. The parameters are stored in the manner that can be referred to by, for example, the control device 5. The parameters are stored corresponding to the operating conditions of the power supply and the like as used in the process S1.

After the process S4 is completed, the processing shown in the flowchart is ended.

For example, the parameters of the digital filter 75 are acquired by the above-described processing. Parameters corresponding to the operating conditions of the power supply and the like can be acquired by repeating the same processing with changed operating conditions of the power supply and the like.

The exemplary embodiments disclosed herein are illustrative in all aspects and do not limit the present disclosure. The above exemplary embodiments can be embodied in various forms. Further, the above-described exemplary embodiments may be omitted, substituted, or changed in various forms without departing from the scope and spirit of the appended claims.

In the above-described exemplary embodiment, there has been described an example where the two digital filters including the digital filter 751 for the detection voltage V and the digital filter 752 for the detection current I are provided. However, only one digital filter may be provided. This will be described with reference to FIG. 14 to FIG. 16.

Figure 14:
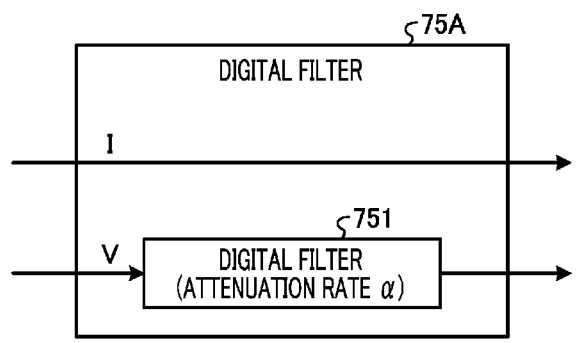
FIG. 14 shows an exemplary block diagram of a digital filter.
Figure 15:
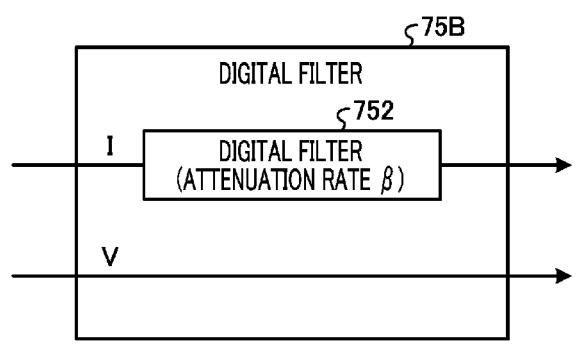
FIG. 15 shows an exemplary block diagram of a digital filter.
Figure 16:
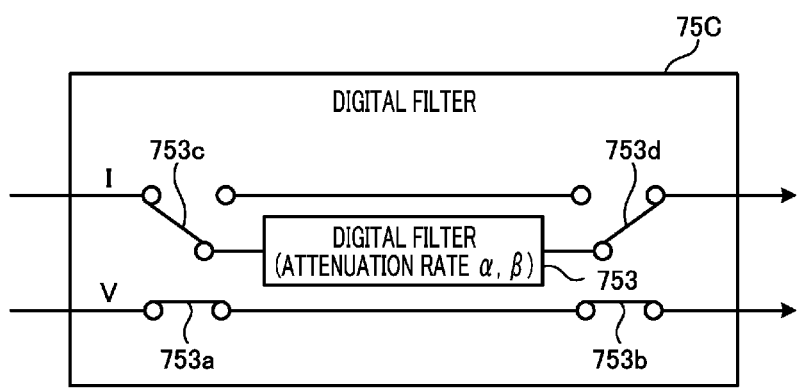
FIG. 16 shows an exemplary block diagram of a digital filter.

FIG. 14 to FIG. 16 show exemplary block diagrams of digital filters. A digital filter 75A shown in FIG. 14 is different from the digital filter 75 (FIG. 8) in that it does not include the digital filter 752. In the digital filter 75A, the filtering of the detection voltage V only is performed by the digital filter 751. In this case, the cutoff frequency of the digital filter 751 corresponds to the attenuation rate α when the attenuation rate β is 1 in Formula (2) or Formula (3).

A digital filter 75B shown in FIG. 15 is different from the digital filter 75 (FIG. 8) in that it does not include the digital filter 751. In the digital filter 75B, the filtering of the detection current I only is performed by the digital filter 752. In this case, the cutoff frequency of the digital filter 752 corresponds to the attenuation rate β when the attenuation rate α is 1 in Formula (2) or Formula (3).

A digital filter 75C shown in FIG. 16 includes a digital filter 753, a switch 753a, a switch 753b, a switch 753c and a switch 753d that switch a filtering target of the digital filter 753 between the detection voltage V and the detection current I. By switching operations of the switch 753a and the switch 753b, whether or not to use the digital filter 753 with respect to the detection voltage V is selected. By switching operations of the switch 753c and the switch 753d, whether or not to use the digital filter 753 with respect to the detection current I is selected. Each switch is controlled by, for example, the control device 5. The cutoff frequency of the digital filter 753 corresponds to the attenuation rate α when the attenuation rate β is 1 or the attenuation rate β when the attenuation rate α is 1 in Formula (2) or Formula (3).

In the above-described exemplary embodiment, there has been described an example where the effective value of the detection current I and the effective value of the detection voltage V are used to calculate the heater resistance value R. However, the present disclosure is not limited to the effective values, and various factors which can be used to calculate the heater resistance value R may be used.

In the above-described exemplary embodiment, there has been described an example where the voltage detector configured to detect the detection voltage V is composed of the resistor 73a, the resistor 73b, the amplifier 73c and the AD converter 74d provided in the heater controller 70. Also, there has been described an example where the current detector configured to detect the detection current I is composed of the resistor 74a, the amplifier 74c and the AD converter 74d provided in the heater controller 70. However, the present disclosure is not limited to these configurations, and various configurations capable of detecting the detection voltage V and the detection current I may be employed. Also, the detection of the detection voltage V and the detection current I may be performed at any position at which both the voltage applied to the heater resistor 253a and the current flowing in the heater resistor 253a can be detected.

In the above-described exemplary embodiment, there has been described an example where the switch 72 is the TRIAC. However, the switch 72 is not limited to the TRIAC, and various devices capable of controlling the power supply to the heater resistor 253a may be used as the switch 72.

In the above-described exemplary embodiment, there has been described an example where the AC power supply 71 is the commercial power supply. However, the power supply 71 is not limited to the commercial power supply, and various power supplies capable of supplying the heating power to the heater resistor 253a may be used as the AC power supply 71.

In the above-described exemplary embodiment, there has been described an example where the control target of the heater controller 70 is the heater 253 provided on the electrostatic chuck 25. However, a heater which can be provided at any position inside the substrate processing apparatus 1 may be included in the control target of the heater controller 70.

In the above-described exemplary embodiment, there has been described an example where the processing target of the substrate processing apparatus 1 is the semiconductor substrate such as the wafer W. However, the processing target of the substrate processing apparatus 1 is not limited to the semiconductor substrate. For example, a substrate such as a liquid crystal substrate or an organic EL substrate may also become the processing target of the substrate processing apparatus 1.

The above-described substrate processing apparatus 1 is specified, for example, as follows. The substrate processing apparatus 1 includes the heater resistor 253a, the digital filter 75 and the controller 76. The heater resistor 253a is a heater resistor which is electrically connected to the source of the noise voltage Vnoise and the noise current Inoise, for example, the power supply. The digital filter 75 filters at least one of the noise voltage Vnoise or the noise current Inoise. The detection voltage V is the digital voltage value detected as the voltage applied to the heater resistor 253a. The detection current I is a detection current detected as a voltage which is calculated from the heater resistor 253a and the current flowing in the heater resistor 253a and which is converted into a digital voltage value. The controller 76 controls the heater temperature T of the heater resistor 253a by using the detection voltage V and the detection current I, at least one of the detection voltage V or the detection current I being filtered by the digital filter 75.

According to the substrate processing apparatus 1, it is possible to filter the noise voltage Vnoise and the noise current Inoise, which can be generated in various manners, by using the digital filter 75 capable of flexibly changing the filtering characteristics. Therefore, it is possible to improve not only the accuracy of calculation of the heater resistance value R but also the accuracy of control of the heater temperature T.

The digital filter 75 may filter at least one of the detection voltage V or the detection current I such that in the filtered detection voltage V, the ratio of the signal voltage Vsys and the noise voltage Vnoise and the ratio of the signal current Isys and the noise current Inoise become close to each other. The signal voltage Vsys corresponds to the detection voltage V when it is assumed that the noise voltage Vnoise is not present. The signal current Isys corresponds to the detection current I when it is assumed that the noise current Inoise is not present. The digital filter 75 may be the low pass filter configured to attenuate at least one of the noise voltage Vnoise or the noise current Inoise. The filtering characteristics of the digital filter 75 can be parameter-controlled, and the parameters of the digital filter 75 may include the cutoff frequency. The heater resistor 253a may be heated with the power supplied from the AC power supply 71, and the heater controller 70 may calculate the heater resistance value R of the heater resistor 253a based on the effective value of the detection voltage V and the effective value of the detection current I. Accordingly, it is possible to reduce the influence of the noise voltage Vnoise and the noise current Inoise on the calculation of the heater resistance value R. As described above, the heater temperature T can be controlled based on the heater resistance value R.

In the digital filter 75, the digital filter 751 (first digital filter) provided for the detection voltage V may have different parameters from those of the digital filter 752 (second digital filter) provided for the detection current I. For example, by setting the parameters as such, even when the degree of influence of the noise voltage Vnoise on the detection voltage V is different from the degree of influence of the noise current Inoise on the detection current I, it is possible to reduce the influence of the noise voltage Vnoise and the noise current Inoise on the calculation of the heater resistance value R.

The heater resistor 253a may be provided in the placing table 20 for the substrate (for example, the wafer W). The heater resistor 253a may be buried in the electrostatic chuck 25 included in the placing table 20. Thus, it is possible to control the temperature of the placing table 20 that supports the substrate and the temperature of the electrostatic chuck 25 that holds the substrate on the placing table 20.

The parameter acquisition method described above with reference to FIG. 13 and the like is also an aspect of the present disclosure. That is, the parameter acquisition method includes the process of measuring the noise voltage Vnoise and the noise current Inoise generated at the heater resistor 253a used in the substrate processing apparatus 1 (process S2) and the process of acquiring the parameters of the digital filter 75 that filter at least one of the detection voltage V or the detection current I by using the measured noise voltage Vnoise and noise current Inoise (process S3 and process S4).

In the acquisition process (process S3 and process S4), the parameters of the digital filter 75 that filter at least one of the detection voltage V or the detection current I such that in the filtered detection voltage V, the ratio of the signal voltage Vsys and the noise voltage Vnoise and the ratio of the signal current Isys and the noise current Inoise become close to each other may be acquired. The parameters may be parameters (for example, cutoff frequency) enabling the digital filter 75 to function as the low pass filter configured to attenuate at least one of the noise voltage Vnoise or the noise current Inoise.

By using the acquired parameters, it is possible to improve the accuracy of control of the heater temperature T as described above.

According to the present disclosure, the accuracy of control of a heater temperature can be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a heater resistor;
a digital filter configured to filter at least one of a detection voltage, which is a digital voltage value detected as a voltage applied to the heater resistor, or a detection current, which is detected as a voltage calculated from the heater resistor and a current flowing in the heater resistor and converted into a digital voltage value; and
a controller configured to control a temperature of the heater resistor with the detection voltage and the detection current, at least one of the detection voltage or the detection current being filtered by the digital filter,
wherein the heater resistor is heated with a power supplied from an AC power supply, and
the controller calculates a resistance value of the heater resistor based on an effective value of the detection voltage and an effective value of the detection current.

2. The substrate processing apparatus of claim 1, wherein the digital filter filters at least one of the detection voltage or the detection current such that a ratio of the detection voltage when it is assumed that a noise voltage is not present and the noise voltage in the filtered detection voltage and a ratio of the detection current when it is assumed that a noise current is not present and the noise current in the filtered detection current become close to each other.

3. The substrate processing apparatus of claim 1, wherein the digital filter is a low pass filter configured to attenuate at least one of a noise voltage or a noise current.

4. The substrate processing apparatus of claim 3, wherein filtering characteristics of the digital filter are allowed to be parameter-controlled, and parameters of the digital filter include a cutoff frequency.

5. The substrate processing apparatus of claim 1, wherein the heater resistor is provided in a placing table on which a substrate is placed.

6. The substrate processing apparatus of claim 5, wherein the heater resistor is buried in an electrostatic chuck included in the placing table.

7. A substrate processing apparatus, comprising:

a heater resistor;

a digital filter configured to filter at least one of a detection voltage, which is a digital voltage value detected as a voltage applied to the heater resistor, or a detection current, which is detected as a voltage calculated from the heater resistor and a current flowing in the heater resistor and converted into a digital voltage value; and a controller configured to control a temperature of the heater resistor with the detection voltage and the detection current, at least one of the detection voltage or the detection current being filtered by the digital filter, wherein the digital filter includes a first digital filter configured to filter the detection voltage and a second digital filter configured to filter the detection current, and the first digital filter has different parameters from those of the second digital filter.

8. The substrate processing apparatus of claim 7, wherein the digital filter filters at least one of the detection voltage or the detection current such that a ratio of the detection voltage when it is assumed that a noise voltage is not present and the noise voltage in the filtered detection voltage and a ratio of the detection current when it is assumed that a noise current is not present and the noise current in the filtered detection current become close to each other.

9. The substrate processing apparatus of claim 7, wherein the digital filter is a low pass filter configured to attenuate at least one of a noise voltage or a noise current.

10. The substrate processing apparatus of claim 9, wherein filtering characteristics of the digital filter are allowed to be parameter-controlled, and parameters of the digital filter include a cutoff frequency.

* * * * *